United States Patent
Goto et al.

(10) Patent No.: US 8,278,408 B2
(45) Date of Patent: Oct. 2, 2012

(54) RESIN COMPOSITION

(75) Inventors: Yoshitsugu Goto, Gunma (JP); Shigeo Hiyama, Gunma (JP); Takuya Okada, Gunma (JP); Jun Watanabe, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/055,099

(22) PCT Filed: Jul. 16, 2009

(86) PCT No.: PCT/JP2009/062893
§ 371 (c)(1),
(2), (4) Date: Jan. 20, 2011

(87) PCT Pub. No.: WO2010/010841
PCT Pub. Date: Jan. 28, 2010

(65) Prior Publication Data
US 2011/0172345 A1 Jul. 14, 2011

(30) Foreign Application Priority Data
Jul. 22, 2008 (JP) ................... 2008-188357

(51) Int. Cl.
*C08G 77/12* (2006.01)
*C08G 77/04* (2006.01)
*C08G 77/20* (2006.01)
(52) U.S. Cl. ................. 528/31; 528/10; 528/15; 528/32
(58) Field of Classification Search .................. None
See application file for complete search history.

(56) References Cited

U.S. PATENT DOCUMENTS

| | | | | | |
|---|---|---|---|---|---|
| 4,448,815 | A | * | 5/1984 | Grenoble et al. | 427/387 |
| 4,562,096 | A | * | 12/1985 | Lo et al. | 427/208.8 |
| 5,008,307 | A | * | 4/1991 | Inomata | 523/220 |
| 5,506,289 | A | * | 4/1996 | McDermott et al. | 524/306 |
| 5,922,795 | A | * | 7/1999 | McDermott et al. | 524/285 |
| 5,928,564 | A | * | 7/1999 | McDermott et al. | 252/407 |
| 6,376,100 | B1 | * | 4/2002 | Shiobara et al. | 428/620 |
| 7,005,475 | B2 | * | 2/2006 | Griswold | 524/861 |

(Continued)

FOREIGN PATENT DOCUMENTS

JP 2691823 B2 12/1997

(Continued)

OTHER PUBLICATIONS

International Search Report for PCT/JP2009/062893.

(Continued)

*Primary Examiner* — Robert S Loewe
(74) *Attorney, Agent, or Firm* — Hoffmann & Baron, LLP

(57) ABSTRACT

Disclosed is a resin composition having an excellent balance between shortness of curing time and longness of pot life. The resin composition contains (A) an organopolysiloxane having an alkenyl group, (B) an organopolysiloxane having a silicon atom-bonded hydrogen atom, (C) a hydrosilylation catalyst, (D) a silane coupling agent and (E) an unsaturated dicarboxylic acid ester. The component (B) contains (B-1) an organopolysiloxane having a molecular weight of not less than 5,000 but not more than 50,000 and (B-2) an organopolysiloxane having a molecular weight of not less than 100 but not more than 5,000, and the ratio of (B-2) to (B-1) is preferably not less than 0.01% by mass but not more than 20% by mass.

16 Claims, 1 Drawing Sheet

U.S. PATENT DOCUMENTS

| | | | |
|---|---|---|---|
| 2005/0049350 A1* | 3/2005 | Tonapi et al. | 524/492 |
| 2005/0228097 A1* | 10/2005 | Zhong | 524/430 |
| 2006/0270792 A1 | 11/2006 | Kashiwagi | |
| 2007/0219312 A1* | 9/2007 | David | 524/588 |
| 2007/0241303 A1* | 10/2007 | Zhong et al. | 252/62.3 T |

FOREIGN PATENT DOCUMENTS

| | | |
|---|---|---|
| JP | 2001-181398 A | 7/2001 |
| JP | 2003-128920 A | 5/2003 |
| JP | 2003-313440 A | 11/2003 |
| JP | 2003-327833 A | 11/2003 |
| JP | 2004-519544 A | 7/2004 |
| JP | 2004-292714 A | 10/2004 |
| JP | 2007002234 A | 1/2007 |
| JP | 3897303 B2 | 3/2007 |
| JP | 2007-131750 A | 5/2007 |
| JP | 4015722 B2 | 11/2007 |
| JP | 2008-45088 A | 2/2008 |
| JP | 2008-115302 A | 5/2008 |
| KR | 10-2007-0037548 A | 4/2007 |

OTHER PUBLICATIONS

Office Action issued to Korean Application No. 10-2011-7006573, mailed May 25, 2012.

* cited by examiner

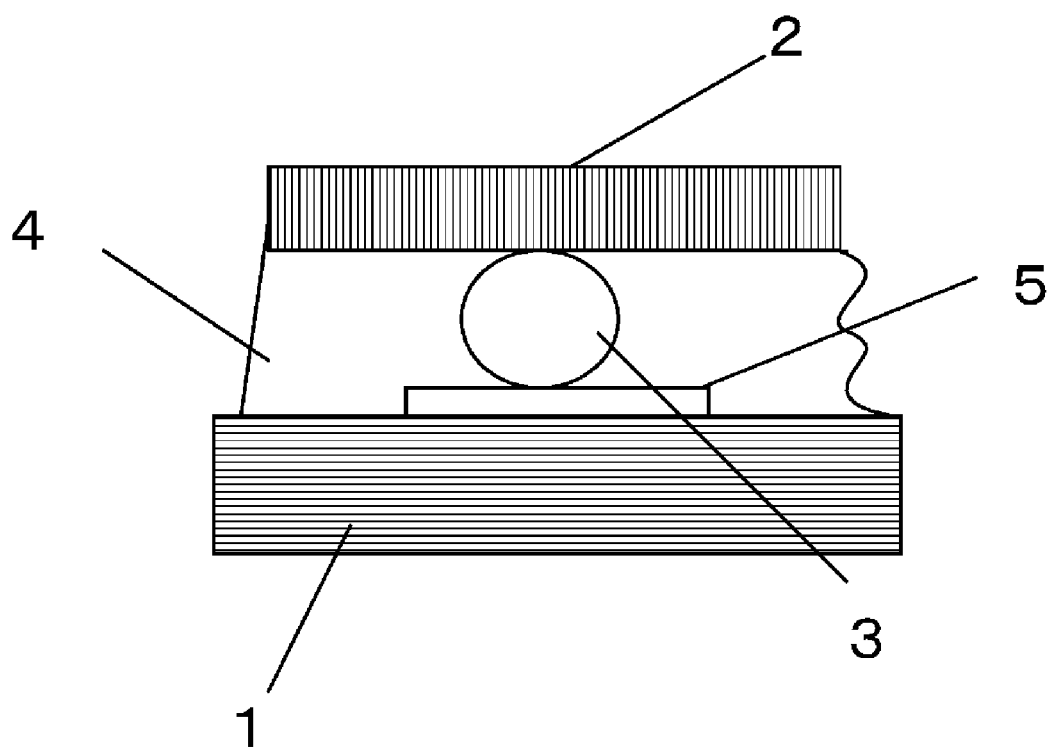

RESIN COMPOSITION

CROSS-REFERENCE TO RELATED APPLICATIONS

This application is the National Stage of International Application No. PCT/JP2009/062893, filed Jul. 16, 2009, which claims the benefit of Japanese Application No. 2008-188357, filed Jul. 22, 2008, the entire contents of both of which are incorporated by reference herein.

FIELD OF THE INVENTION

The present invention relates to a resin composition, for example a resin composition used in an underfill material for sealing a gap between two or more substrates.

BACKGROUND OF THE INVENTION

There has been a demand in recent years for downsizing of LSI devices due to the increasing popularity of small electronic devices such as digital cameras, integrated VTRs, mobile telephones, or the like. A conventional chip-mounting package can protect a semiconductor bare chip for an LSI or the like, or facilitates testing. New packages have been applied such as CSP (chip size package) or BGA (ball grid array) in which a chip size is reduced to that of a bare chip while retaining the characteristics of the above convention chip-mounting packages.

A chip carrier without a lead such as a CSP or BGA is a relatively small package that includes a plurality of input/output connections between a chip and the corresponding substrate. A chip carrier without a lead is generally a package that includes a single-layer ceramic such as alumina. The ceramic forms a chip carrier, that is to say, a base, and the chip is mounted onto that base. The package with a chip mounted thereon is then mounted on a larger printed circuit board (PCB), or the like. More specifically, a contact pad that exhibits a mirror image relationship with the contact pad of the package is formed on a PCB. After aligning both components, the chip is electrically and mechanically connected and then surface-mounted with the PCB by reflow soldering, or the like. Normally, soldering paste or solder bump is used when the package is connected to the PCB by solder. A sealing resin (underfill material) such as an epoxy is generally injected into the gap created by the solder bump between the package substrate and the PCB substrate.

When the chip is mounted on a package or PCB, the surface area must be reduced. A flip-chip bonding method is an example of a method of reducing surface area. This method orients a connection pad on an upper surface of the chip towards a lower surface, and uses the solder bump to connect the pad onto the facing package or PCB. An underfill material is also injected when using this method since a gap is formed as a result of the solder bump between the chip substrate surface and a chip carrier substrate, or between a chip substrate surface and a PCB substrate. The underfill material does not only plug the space or gap in the connection portion, but also has the function of sealing the electrical connection points and protecting the points from a periphery, and adhering the package substrate and the PCB substrate. In addition, the material has the function of preventing the application of an excessive force on the solder bump connection portion that is a small mechanical junction point.

The filling method for the underfill material includes two methods including a capillary flow method that uses capillary action to fill from the chip peripheral edge, and a compression flow method that drops an underfill material in advance onto a position to be filled, and then mounts a substrate such as a chip or a package thereon. Recently, the capillary flow method is most commonly applied. In this method, since it may be the case that excessive underfill material may flow out from the outer periphery of a substrate such as a chip, package, or the like, testing is performed in relation to the type or amount of underfill material, or for strict management of the processing steps.

Normally, the underfill material is often an epoxy resin that approximates the coefficient of linear expansion of the solder. In this manner, durability in relation to temperature fatigue can be improved. Flow characteristics can be adjusted by including an inactive filling material. An anhydride curing agent can also be included for the object of improving heat cycle resistance characteristics, or the like.

However when using a solid curing agent such as a conventional dicyandiamide, or the like, there is the problem that the epoxy resin and the curing agent become separated. When using an epoxy resin that includes a known anhydride curing agent, the problem arises that bonding, durability, and heat cycle resistance are not achieved to a satisfactory level. Since a long period of at least one hour is required when using an epoxy resin, the problem arises that productivity is adversely affected.

A silicone resin is a known example of a highly durable resin having heat resistance characteristics. It is known that silicone resins include various curing types such as a heat-curing type, a moisture-curing type, and a photo-curing type. An addition-reaction silicone resin that employs an addition reaction between an alkenyl group and silicon atom-bonded hydrogen atom (hereafter referred to as a "hydrosilyl group") exhibits excellent curing characteristics, and does not produce reaction by-products. Therefore suitable applications include protective materials for electric and electronic components such as integrated circuits or the like, sealing materials, underfill materials for circuit boards, glob top materials, dam filling materials, sealing for electronic modules, conformal coating, bonding materials, photosemiconductor sealing materials, component die-bonding materials, or the like (Patent Literature 2-9).

[Patent Document 1] Japanese Patent No. 3897303
[Patent Document 2] Japanese Patent No. 2691823
[Patent Document 3] Japanese Patent No. 4015722
[Patent Document 4] Japanese Unexamined Patent Application (Translation of PCT Application), Publication No. 2004-519544
[Patent Document 5] Japanese Unexamined Patent Application, Publication No. 2008-45088
[Patent Document 6] Japanese Unexamined Patent Application, Publication No. 2003-313440
[Patent Document 7] Japanese Unexamined Patent Application, Publication No. 2003-327833
[Patent Document 8] Japanese Unexamined Patent Application, Publication No. 2001-81398
[Patent Document 9] Japanese Unexamined Patent Application, Publication No. 2007-131750

SUMMARY OF THE INVENTION

Problems to be Solved by the Invention

However a known silicone composition requires time for curing, and does not exhibit satisfactory performance as an underfill material. The known silicone compositions above do not exhibit a satisfactory pot life at room temperature which represents the normal atmospheric conditions during assembly operations of the electric and electronic components.

The present invention is proposed in light of the above circumstances. In particular, the present invention has the object of providing a resin composition used as an underfill material, that exhibits a balance between a short curing time and a long pot life.

Means for Solving the Problems

The present invention is a resin composition that includes
(A) an organopolysiloxane that includes an alkenyl group,
(B) an organopolysiloxane that includes a hydrosilyl group,
(C) a hydrosilylation catalyst,
(D) a silane coupling agent, and
(E) an unsaturated dicarboxylic acid ester.

The organopolysiloxane (B) having a hydrosilyl group includes
(B-1) an organopolysiloxane having a molecular weight of at least 5,000 to 50,000 or less,
(B-2) an organopolysiloxane having a molecular weight of at least 100 to 5,000 or less, and
in which it is preferred that the ratio of (B-2) to (B-1) is at least 0.01 mass % to 20 mass % or less.

The resin composition according to the present invention preferably includes a heat-conduction filler (F).

The resin composition according to the present invention preferably permeates into a gap of 100 μm or less at 23±2° C. between the two or more substrates, and is preferably curable at a temperature of at least 10° C. to 150° C. or less in a period of at least one minute to 60 minutes or less. The resin composition is preferably used as an underfill material. The viscosity of the resin composition is preferably within the range of at least 1 mPa·s to 4,000 mPa·s or less at 23±2° C.

Effects of the Invention

According to the present invention, a resin composition is obtained that exhibits an excellent balance between a short curing time and a long pot life.

BRIEF DESCRIPTION OF THE DRAWINGS

FIG. 1 is a schematic view showing a sectional surface that describes the configuration of a semiconductor device according to a first embodiment of the present invention.

DETAILED DESCRIPTION OF THE INVENTION

The embodiments of the present invention will be described in further detail hereafter.
Description of Technical Terms In the present specification, a silicone is generally referred to as an organopolysiloxane.

In the present specification, molecular weight means the weighted average molecular weight in terms of polystyrene that is measured using gel permeation chromatography (hereafter "GPC"), or the like.

In the present specification, room temperature means an atmosphere of 23±2° C.

In the present specification, "two or more substrates" may include a configuration in which there is at least a gap between the substrates, and may include a configuration in which a part of the two or more substrates are bonded. Outline of the Embodiments Resin Composition The resin composition of the present invention includes (A) an organopolysiloxane that includes an alkenyl group, (B) an organopolysiloxane that includes a hydrosilyl group, (C) a hydrosilylation catalyst, (D) a silane coupling agent, and (E) an unsaturated dicarboxylic acid ester.

The resin composition according to the present invention preferably includes (A) an organopolysiloxane that includes at least two alkenyl groups in one molecule, (B) an organopolysiloxane that includes at least two hydrosilyl groups in one molecule, (C) a hydrosilylation catalyst, (D) a silane coupling agent having at least one silicon atom-bonded hydrogen atom in one molecule, and (E) an unsaturated dicarboxylic acid ester.

The resin composition according to the present invention for example may be used as an underfill material that seals a gap between at least two substrates according to the first embodiment.

The above composition provides a resin composition that exhibits an excellent balance between curing in a short time and a long pot time at room temperature which represents the normal atmospheric conditions during assembly operations of the electric and electronic components. Furthermore the resin composition enables satisfactory performance as an underfill material that exhibits excellent durability, bonding characteristics, and sufficient permeability into a micrometer-scale gap.

"(A) Organopolysiloxane Including Alkenyl Group"

The organopolysiloxane preferably includes at least two alkenyl groups in one molecule. The alkenyl group in component (A) includes a vinyl group, an allyl group, a butenyl group, pentenyl group, a hexenyl groups and a heptenyl group. In particular, a vinyl group is preferred due to excellent curing characteristics.

In component (A), a group other than an alkenyl group that bonds with a silicon atom includes an alkyl group such as a methyl group, an ethyl group, a propyl group, a butyl group, a pentyl group, a hexyl group, or the like, an aryl group such as a phenyl group, a tolyl group, a xylyl group, or the like, an aralkyl group such as a benzyl group, a phenethyl group, or the like, a substituted or non-substituted monovalent hydrocarbon group, except for an alkenyl group, of a halogenated alkyl group including a 3-chloropropyl group, a 3,3,3-trifluoropropyl group, or the like, an alkoxy group such as a methoxy group, an ethoxy group, a propoxy group, or the like, and a hydroxyl group. A methyl group and/or a phenyl group are particularly preferred due to exhibiting excellent heat resistance characteristics, and a methyl group is still more preferred.

There is no particular limitation on the molecular structure of component (A), and the structure may be exemplified by a partially branched straight chain, a branched chain, or a network structure.

The organopolysiloxane in component (A) includes a methylvinylsiloxane.dimethylsiloxane copolymer capped at both molecular terminals with trimethylsiloxy groups, a methylvinylpolysiloxane capped at both molecular terminals with trimethylsiloxy groups, a methylphenylsiloxane.methylvinylsiloxane copolymer capped at both molecular terminals with trimethylsiloxy groups, a methylphenylsiloxane.methylvinylsiloxane.dimethylsiloxane copolymer capped at both molecular terminals with trimethylsiloxy groups, dimethylpolysiloxane capped at both molecular terminals with dimethylvinylsiloxy groups, methylvinylpolysiloxane capped at both molecular terminals with dimethylvinylsiloxy groups, methylphenylpolysiloxane capped at both molecular terminals with dimethyvinylsiloxy groups, a methylvinylsiloxane.dimethylsiloxane copolymer capped at both molecular terminals with dimethylvinylsiloxy groups, a methylphenylsiloxane.dimethylsiloxane copolymer capped at both molecular terminals with dimethylvinylsiloxy groups, a methylvinylsiloxane.dimethylsiloxane copolymer capped at both molecular terminals with dimethylhydroxysiloxy groups, methylvinylpolysiloxane capped at both molecular terminals with dimethylhydroxysiloxy groups, a methylphenylsiloxane.methylvinylsiloxane. dimethylsiloxane copolymer capped at both molecular terminals with dimethylhydroxysiloxy groups, an organopolysiloxane formed from units of $R_3SiO_{1/2}$ and units of $SiO_{4/2}$, an organopolysiloxane formed from units of $RSiO_{3/2}$, an organopolysiloxane formed from units of $R_2SiO_{2/2}$ and units of $RSiO_{3/2}$, an organopolysiloxane formed from units of $R_2SiO_{2/2}$, units of $RSiO_{3/2}$ and units of $SiO_{4/2}$, in addition to a mixture of one or two or more of the above organopolysiloxanes. The letter "R" in the organopolysiloxanes above denotes a substituted or non-substituted monovalent hydrocarbon group, and denotes an alkyl group such as a methyl group, an ethyl group, a propyl group, a butyl group, a pentyl group, an octyl group, or the like, an alkenyl group such as a vinyl group, an allyl group, a butenyl group, pentenyl group, a hexenyl group, or the like, an aryl group such as a phenyl group, a tolyl group, a xylyl group, or the like, an aralkyl group such as a benzyl group, a phenethyl group, or the like, a halogenated alkyl group including a 3-chloropropyl group, a 3,3,3-trifluoropropyl group, or the like. However at least two of the R groups in the organopolysiloxane must be an alkenyl group.

The molecular weight of component (A) is preferably within the range of at least 1,000 and 50,000 or less, and still more preferably at least 5,000 and 40,000 or less. Sufficient bonding characteristics are obtained at a value of at least 1,000, and improved permeability is obtained when 50,000 or less.

The use amount of component (A) is preferably at least 25 parts by mass to 75 parts by mass or less relative to 100 parts by mass of the total amount of component (A) and component (B), and still more preferably at least 30 parts by mass to 70 parts by mass or less. Superior curing characteristics are obtained when an amount of at least 25 parts by mass is used. When an amount of 75 parts by mass or less is used, improved curing characteristics can be obtained.

(B) Organopolysiloxane Including Hydrosilyl Group

The organopolysiloxane in component (B) preferably includes at least two hydrosilyl groups in one molecule.

In component (B), a group other than an hydrosilyl group that bonds with a silicon atom includes an alkyl group such as a methyl group, an ethyl group, a propyl group, a butyl group, a pentyl group, a hexyl group, or the like, an aryl group such as a phenyl group, a tolyl group, a xylyl group, or the like, an aralkyl group such as a benzyl group, a phenethyl group, or the like, a substituted or non-substituted monovalent hydrocarbon group of a halogenated alkyl group or the like that includes a 3-chloropropyl group, a 3,3,3-trifluoropropyl group, or the like, an alkoxy group such as a methoxy group, an ethoxy group, a propoxy group, or the like, and a hydroxyl group. A methyl group or a phenyl group is particularly preferred due to exhibiting excellent heat resistance characteristics.

There is no particular limitation on the molecular structure of component (B), and the structure may be exemplified by a partially branched straight chain, a branched chain, or a network structure.

The organopolysiloxane in component (B) includes methylhydrogenpolysiloxane capped at both molecular terminals with trimethylsiloxy groups, a methylhydrogensiloxane.dimethylsiloxane copolymer capped at both molecular terminals with trimethylsiloxy groups, a methylphenylsiloxane. methylhydrogenpolysiloxane copolymer capped at both molecular terminals with trimethylsiloxy groups, a methylphenylsiloxane. methylhydrogensiloxane.dimethylsiloxane copolymer capped at both molecular terminals with trimethylsiloxy groups, dimethylpolysiloxane capped at both molecular terminals with dimethylhydrogensiloxy groups, methylhydrogenpolysiloxane capped at both molecular terminals with dimethylhydrogensiloxy groups, a methylhydrogensiloxane.dimethylsiloxane copolymer capped at both molecular terminals with dimethylhydrogensiloxy groups, a methylphenylsiloxane.dimethylsiloxane copolymer capped at both molecular terminals with dimethylhydrogensiloxy groups, a methylphenylpolysiloxane capped at both molecular terminals with dimethylhydrogensiloxy groups, a methylhydrogenpolysiloxane capped at both molecular terminals with dimethylhydrogensiloxy groups, a methylhydrogensiloxane.dimethylsiloxane copolymer capped at both molecular terminals with dimethylhydroxysiloxy groups, a methylphenylsiloxane. methylhydrogensiloxane copolymer capped at both molecular terminals with dimethylhydroxysiloxy groups, a methylphenylsiloxane. methylhydrogensiloxane.dimethylsiloxane copolymer capped at both molecular terminals with dimethylhydroxysiloxy groups, in addition to a mixture of one or two or more of the above organopolysiloxanes.

The molecular weight of component (B) is preferably within the range of at least 100 to 50,000 or less, and still more preferably at least 500 to 40,000 or less. Sufficient bonding characteristics are obtained when the molecular weight is at least 100, and improved permeability is obtained when 50,000 or less.

Component (B) may include a combination of two or more substances having different molecular weights. It is preferably configured from a molecular weight including a high molecular weight component in which the molecular weight (B-1) is within a range of at least 5,000 to 50,000 or less, and a low molecular weight component in which the molecular weight (B-2) within a range of at least 1,000 to 5,000 or less. In this case, superior curing characteristics, permeability characteristics and bonding characteristics are obtained. The molecular weight of the high molecular weight component (B-1) is preferably in the range of more than 5,000 to 50,000 or less, more preferably in the range of at least 10,000 to 45,000 or less, and most preferably in the range of at least 20,000 to 40,000 or less. The molecular weight of the low molecular weight component (B-2) is preferably in the range of at least 300 to 4,000 or less, and more preferably in the range of at least 500 to 3,000 or less.

The proportion of the component (B-2) to the component (B-1) is preferably in the range of at least 0.01 mass % to 20 mass % or less, and more preferably in the range of at least 0.1 mass % to 10 mass % or less.

The use amount of component (B) is preferably at least 25 parts by mass to 75 parts by mass or less relative to 100 parts by mass of the total weight of component (A) and component (B), and more preferably at least 30 parts by mass to 70 parts by mass or less. When an amount of at least 25 parts by mass is used, superior curing characteristics are obtained, and when an amount of 75 parts by mass or less is used, superior curing characteristics are obtained.

The chemical equivalent ratio of the alkenyl base in component (A) and the hydroxyl base in component (B) is preferably in the range of at least 0.2 and 1.5 or less when the chemical equivalent ratio is defined as =hydrosilyl group/alkenyl group, with at least 0.3 to 1.2 or less being particularly preferred. When an amount of at least 0.2 is used, superior curing characteristics are obtained, and when an amount of 1.5 or less is used, a superior pot life is obtained.

(C) Hydrosilylation Catalyst (C) The hydrosilylation catalyst forming component (C) is a catalyst for promoting curing of the composition. The component (C) includes a platinum compound catalyst, rhodium compound catalyst, or palladium compound catalyst. The platinum compound catalyst is particularly preferred in light of excellent curing characteristics.

The platinum compound catalyst includes platinum black, platinum-supported alumina powder, platinum-supported silica powder, platinum-supported carbon powder, chloroplatinic acid, an alcohol solution of chloroplatinic acid, a platinum olefin derivative, a platinum alkenylsiloxane derivative, and a mixture of a platinum catalyst and an organopolysiloxane including an alkenyl. The platinum compound catalyst includes thermoplastic resin particles of methylmethacrylate resin, polycarbonate, polystyrene, silicon resin, or the like, and includes the platinum compound catalyst. Of the above, in view of curing characteristics, a mixture of a platinum catalyst and an organopolysiloxane including an alkenyl, for example, an alkenyl siloxane derivative is preferred. A mixture of the platinum catalyst and the organopolysiloxane that contains an alkenyl includes "XE14-B8530A manufactured by Momentive Co., Ltd." that is an organopolysiloxane including two vinyl groups in one molecule that includes a platinum compound catalyst.

The use amount of component (C) is an amount that is sufficient for curing of the resin composition above. When component (C) is a platinum compound catalyst, the amount of the platinum metal in component (C) relative to the total amount of component (A) and component (B) is preferably an amount within a range of at least 0.01 ppm to 100 ppm or less in mass units, and a range of at least 0.1 ppm to 10 ppm or less is particularly preferred. When the platinum metal in component (C) relative to the total amount of component (A) and component (B) is at least 0.01 ppm, the resulting resin composition can be sufficiently cured, and when less than 100 ppm, the resulting cured material is not colored.

(D) Silane Coupling Agent

The silane coupling agent in component (D) preferably includes a silane coupling agent that includes at least one hydrosilyl group in one molecule of (D), and in particular, a silane coupling agent that includes at least two hydrosilyl groups in one molecule is preferred. A silane coupling agent that includes at least three hydrosilyl groups in one molecule still more preferred. Superior curing characteristics and bonding characteristics are enabled by including a silane coupling agent that contains at least one hydrosilyl group in one (D) molecule. The silane coupling agent that contains at least a hydrosilyl group in one molecule includes an organo alkoxysilane. The organo alkoxysilane includes cyclic methylhydrogensiloxane.methyl(trimethoxysilylethyl)siloxane, cyclic methylhydrogensiloxane.methyl(trimethoxysilylpropyl)siloxane, cyclic methylhydrogensiloxane.methyl (2-methylpropanoate propyltrimethoxysilane) siloxane, or the like.

Another silane coupling agent may be used to impart superior attachment within a range that does not adversely affect target physical properties.

The use amount of component (D) is preferably at least 0.1 parts by mass to 20 parts by mass or less relative to 100 parts by mass of the total amount of component (A) and component (B), and still more preferably at least 0.5 parts by mass to 10 parts by mass or less. Superior bonding characteristics are imparted to the resin composition when an amount of at least 0.1 parts by mass is used, and when an amount 20 parts by mass or less is used, an adverse effect on the storage stability of the resulting resin composition can be avoided.

(E) α,β-Unsaturated Dicarboxylic Acid Ester

The composition according to the present invention includes an unsaturated dicarboxylic acid ester to obtain a resin composition with a superior pot life. The unsaturated dicarboxylic acid ester is preferably an α,β-unsaturated dicarboxylic acid ester. The α,β-unsaturated dicarboxylic acid ester includes dimethyl maleate, diethyl maleate, dipropyl maleate, dibutyl maleate, diamyl maleate, dimethyl fumarate, diethyl fumarate, dipropyl fumarate, dibutyl fumarate, diamyl fumarate, dimethyl citraconate, diethyl citraconate, dipropyl citraconate, dibutyl citraconate, and diamyl citraconate, or the like. However the unsaturated dicarboxylic acid ester is not limited to an α,β-unsaturated dicarboxylic acid ester, and may include dimethyl itaconate, diethyl itaconate, dipropyl itaconate, dibutyl itaconate, and diamyl itaconate, or the like. The above compounds may be used singly or in combinations or two or more.

To obtain a superior pot life and rapid curing characteristics, the use amount of component (E) is preferably in a range of at least 0.005 parts by mass to 1 parts by mass or less relative to 100 parts by mass of the total mass of component (A) and component (B), and more preferably in a range of at least 0.01 parts by mass to 1 parts by mass or less.

The composition according to the present invention may contain various types of curing inhibiting agents within a range that does not adversely affect the target physical properties.

(F) Heat-Conduction Filler

The composition may contain a heat-conduction filler in order to improve heat conduction properties and enable effective dispersion of heat produced by sealed elements.

The heat-conduction filler includes oxide fillers such as crystalline silica, aluminum oxide, zinc oxide, or the like, nitrogen fillers such as aluminum nitride, boron nitride, or the like, metal fillers such as gold, platinum, silver, copper, nickel, aluminum, or the like, carbon-compound fillers such as diamond, graphite, or the like. Of the above compounds, aluminum oxide is preferred due to superior heat-conduction properties, and insulation properties.

The maximum particle diameter of the particles of the heat-conduction filler is preferably at least 1 μm to 100 μm or less, and still more preferably at least 3 μm to 20 μm or less. Viscosity is conspicuously increased and permeability is not adversely affected when at least 1 μm. When particle diameter is 100 μm or less, the composition can suitably permeate into a gap of 100 μm or less.

The use amount of the component (F) is preferably in a range of at least 50 parts by mass to 400 parts by mass or less relative to 100 parts by mass of the total mass of component (A) and component (B), and more preferably in a range of at least 100 parts by mass to 300 parts by mass or less. Sufficient heat-conduction properties are obtained when at least 50 parts by mass. Viscosity is conspicuously increased and permeability is not adversely affected when 400 parts by mass or less.

An inorganic filler other than a heat-conduction filler may be added as an optional component within a range that does not adversely affect the object of the present invention to the composition to impart a suitable hardness and mechanical strength to the resulting composition.

The resin composition above may include, within a range that does not adversely affect the object of the present invention, an additive such as a generally employed solvent, extender, stiffener, plasticizer, thickening agent, thixotropy-imparting agent, chelating agent, dye, pigment, flame retardant, surface active agent, or the like.

Method of Manufacture

The resin composition above may be manufactured using a known stirring device or mixing device. The resin composition may be used as a one-part configuration or two-part configuration. The method of manufacturing in a one-part configuration may be exemplified by mixing in advance (A) an organopolysiloxane including an alkenyl group, (B) an organopolysiloxane including a hydrosilyl group, (D) a silane coupling agent, (E) an unsaturated carboxylic acid ester, and finally adding (C) a hydrosilylation catalyst, or by mixing in advance (A) an organopolysiloxane including an alkenyl group, (C) a hydrosilylation catalyst, (D) a silane coupling agent, (E) an unsaturated carboxylic acid ester, and finally adding (B) an organopolysiloxane including a hydrosilyl group.

Viscosity

The viscosity of the resin composition is preferably within a range at room temperature of at least 1 mPa·s to 4,000 mPa·s or less, and in particular 10 mPa·s to 2,000 mPa·s or less in view of enabling suitable filling characteristics in an atmosphere at room temperature.

Curing Conditions

Preferred curing conditions for the resin composition execute curing within a temperature range of at least 10° C. to 150° C. or less for at least one minute to 60 minutes or less to thereby result in satisfactory bonding characteristics and sealing performance. In particular, in view of productivity, curing is preferably performed within a temperature range of at least 15° C. to 150° C. or less.

Structural Body

The structural body is formed by injecting and filling the resin composition as an underfill material to thereby seal a gap between at least two substrates. This type of structural body may be exemplified by semiconductor devices, electronic components, printed circuit boards, or the like. Various types of electronic components or the like such as semiconductor elements can be sealed by the above resin composition. The method of manufacturing the structural body of a semiconductor or the like may be a general manufacturing method that is known. The resin composition exhibits an excellent balance between a long pot life at room temperature which represents the normal atmospheric conditions during assembly operations of the electric and electronic components. The resin composition has satisfactory performance as an underfill material that exhibits excellent durability, bonding characteristics, and sufficient permeability into a micrometer-scale gap. As a result, downsizing, weight reduction, high functionality and high quality can be imparted to the resulting electronic component.

FIG. 1 is a schematic view describing the configuration of a semiconductor device applying the resin composition according to a first embodiment of the present invention. For example, a substrate for a flip-chip BGA semiconductor device includes a flip-chip BGA semiconductor chip 2 that is disposed through a plurality of solder bumps 3 and electrodes 5 on a wiring pattern surface of a wiring board 1. An underfill material 4 is injected to fill and seal a gap between the wiring board 1 and the semiconductor chip 2. At this time, the injection and filling of the underfill material 4 is performed at room temperature, and curing is performed at least 10° C. to 150° C. or less, for at least one minute to 60 minutes or less.

EXAMPLES

Although the present invention will be described in further detail below making reference to the examples, the present invention is not thereby limited by the examples. The following compounds are selected as various components of the compositions stated in the examples and the comparative examples. In the absence of an express indication to the contrary, tests are performed at room temperature and at a relative humidity of 50 mass %.

(a-1) Organopolysiloxane containing two vinyl groups per molecule and containing a platinum compound catalyst (including platinum content of 6.3 ppm, and the organopolysiloxane includes a methyl group),
Molecular Weight: 23,000 Vinyl Group Content Ratio: 0.70 mol %

(a-2) Organopolysiloxane containing two vinyl groups per molecule and containing a platinum compound catalyst (including platinum content of 8.0 ppm, and the organopolysiloxane includes a methyl group),
Molecular Weight: 28,000 Vinyl Group Content Ratio: 0.59 mol %

(a-3) Organopolysiloxane containing two vinyl groups per molecule and containing a platinum compound catalyst (including platinum content of 7.0 ppm, and the organopolysiloxane includes a methyl group),
Molecular Weight: 34,000 Vinyl Group Content Ratio: 0.54 mol %

(b-1) Organopolysiloxane containing at least two hydrosilyl groups per molecule,
Molecular Weight: 24,000 Hydrosilyl Group Content Ratio: 0.45 mol %

(b-2) Organopolysiloxane containing at least two hydrosilyl groups per molecule,
Molecular Weight: 700 Hydrosilyl Group Content Ratio: 10 mol %

(b-3) Organopolysiloxane containing at least two hydrosilyl groups per molecule,
Molecular Weight: 33,000 Hydrosilyl Group Content Ratio: 0.55 mol %

(d-1) Silane coupling agent containing three hydrosilyl groups per molecule (organo alkoxysilane)

(e-1) α,β-unsaturated carboxylic acid diester "dimethyl maleate manufactured by Wako Pure Chemical Industries Ltd.".

(e-2) α,β-unsaturated carboxylic acid diester "diethyl maleate manufactured by Wako Pure Chemical Industries Ltd.".

(f-1) Aluminum oxide (maximum particle diameter: 20 μm) "AW15-20 manufactured by Micron Co., Ltd.".

(f-2) Aluminum oxide (maximum particle diameter: 15 μm) "AX3-15 manufactured by Micron Co., Ltd.".

In the comparative examples, a commercially available epoxy underfill material is used.

Various physical characteristics are measured as described below.

Maximum Particle Diameter

Measurements are performed using a laser diffraction particle distribution measurement device, SALD-2200 manufactured by the "Shimadzu Corporation".

Molecular Weight

Measurements are performed under the following conditions by preparing an analytical curve based on a reference polystyrene using a GPC method.

Solvent (mobile phase): THF,
Degasifier: ERC-3310 manufactured by ERMA Co., Ltd.,
Pump: PU-980 manufactured by JASCO Corporation,
Flow Rate: 1.0 ml/min,
Autosampler: AS-8020 manufactured by TOSOH Corporation,
Column Oven: L-5030 manufactured by Hitachi, Ltd.,
Temperature setting: 40° C., Column structure: two 6.0 mm ID×4.0 cm TSK guard columns MP(xL) manufactured by TOSOH Corporation, and two TSK-Gelmultipore HXL-M 7.8 mm ID×30.0 cm columns manufactured by TOSOH Corporation are provided for a total of four columns.

Detection device: RI L-3350 manufactured by Hitachi, Ltd.,

Data processing: SIC480 data station.

Content Ratio of Alkenyl Groups and Hydrosilyl Group

Measurements are performed under the following conditions using a $^1$H-NMR to thereby calculate the content ratio of the alkenyl groups and hydrosilyl groups.

Solvent: heavy chloroform

Device: ECP-300NMR system manufactured by JEOL Ltd. Alkenyl Group Content

Alkenyl group content (mol %)=[(hydrogen peak of alkenyl group (approximately at least 5.5 ppm to 6.5 ppm or less) area) (hydrogen peak of methyl group (approximately 0 ppm) area)]×100

Hydrosilyl Group Content

Hydrosilyl group content (mol %)=[(hydrogen peak of hydrosilyl group (approximately at least 5.5 ppm to 6.5 ppm or less)) area÷(hydrogen peak of methyl group (approximately 0 ppm) area)]×100

Viscosity

B-type viscometer is used to perform measurements at a rotation speed of 20 rpm and a temperature of 25° C.

Evaluation of Permeability Characteristics

Impregnation Distance

A test piece is prepared by adhering two slide glasses having a width of 25 mm×length 75 mm×thickness 1.2 mm. When the slide glasses are adhered, a spacer is used to create a gap having a width of 10 mm×length 60 mm×thickness Y μm between the two slide glasses. Two types of test pieces are prepared with Y=a thickness of 20 μm, and a thickness of 80 μm. 0.2 ml of the resin is coated in an atmosphere of 25±5° C. with a syringe onto one side of a gap, and three minutes after coating, the impregnation distance of the resin composition is measured.

Evaluation of Curing Characteristics

Storage Modulus E'

A cured body that is heat cured in an oven in an atmosphere of 150° C. for 60 minutes having a configuration of width 5 mm×length 70 mm×thickness 1 mm is prepared. The storage modulus E' is measured under conditions of tension mode and frequency of 1 Hz using a dynamic viscosity spectrum (DMS 210 manufactured by SII Nano Technology Inc.).

Evaluation of Bonding Characteristics

Tensile Shear Bonding Strength

The resin composition is coated onto one side of a glass test piece (width 25 mm×length 25 mm×thickness 2 mmt) in accordance with Japanese Industrial Standard K 6856. Thereafter, another glass test piece is laminated and adhered to form a bonding thickness of 20 μm, and heat cured for 60 minutes in an oven in an atmosphere of 150° C. to form a test piece. The tensile shear bonding strength (units: MPa) is measured at a tension speed of 10 mm/minute in an environment of temperature 23° C. and relative humidity of 50%.

Heat Conduction Characteristics

Heat Conduction Rate

The heat conduction rate of a cured body that is heat cured in an oven in an atmosphere of 150° C. for 60 minutes having a configuration of width 10 mm×length 10 mm×thickness 1 mm is measured using a Xenon Laser Flash thermal diffusivity measurement device (LFA447 manufactured by NETZSCH Gmbh). The heat conduction rate is measured at a temperature of 25° C.

Evaluation of Room-Temperature Pot Life

Viscosity Increase Rate

A 100 ml polyethylene vessel filled with the resin composition is allowed to stand at 23±2° C., and after 24 hours, the viscosity is measured.

The viscosity increase rate(%)=[(viscosity after 24 h−initial viscosity)/(initial viscosity)]×100

Examples 1-21 and Comparative Example 1-3

A resin composition is prepared using the components shown in Table 1 to Table 3 using the types of raw materials as shown in Table 1-3. The resulting resin composition is evaluated in relation to pot life at room temperature for viscosity, permeability, curing characteristics, bonding characteristics, and heat conductivity. The results are shown in Table 1 to Table 3.

TABLE 1

|  | Unit | Example 1 | Example 2 | Example 3 | Example 4 | Example 5 | Example 6 | Example 7 |
|---|---|---|---|---|---|---|---|---|
| (a-1) | Parts by Mass | 50.00 | 50.00 | 50.00 | 50.00 | 50.00 | 50.00 | 50.00 |
| (b-1) | Parts by Mass | 50.00 | 50.00 | 50.00 | 50.00 | 50.00 | 50.00 | 50.00 |
| (b-2) | Parts by Mass | 0.40 | 0.40 | 0.40 | 0.40 | 0.40 | 1.00 | 3.00 |
| (d-1) | Parts by Mass | 5.00 | 10.00 | 0.50 | 5.00 | 5.00 | 5.00 | 5.00 |
| (e-1) | Parts by Mass | 0.03 | 0.03 | 0.03 | 0.01 | 1.00 | 0.03 | 0.03 |
| (f-1) | Parts by Mass |  |  |  |  |  |  |  |
| (f-2) | Parts by Mass |  |  |  |  |  |  |  |
| (C) Components | ppm | 3.2 | 3.2 | 3.2 | 3.2 | 3.2 | 3.2 | 3.2 |
| Chemical Equivalent Ratio(hydrosilyl group/alkenyl group) |  | 0.4 | 0.4 | 0.4 | 0.4 | 0.4 | 0.5 | 0.8 |
| Viscosity (mPa · s) |  | 350 | 330 | 370 | 350 | 340 | 340 | 330 |
| Impregnation Distance (mm) | 20 μm | 10 | 11 | 10 | 10 | 10 | 10 | 11 |
| 25 ± 5° C. | 80 μm | 21 | 23 | 20 | 21 | 21 | 22 | 23 |
| Curing Characteristics Storage Modulus (Mpa) |  | 0.8 | 0.9 | 0.7 | 0.8 | 0.8 | 1.0 | 1.2 |
| Tensile Shear Bonding Strength (MPa) |  | 1.6 | 2.0 | 1.0 | 1.6 | 0.7 | 1.6 | 1.7 |
| Heat Conduction Rate (W/m · K) |  | 0.2 | 0.2 | 0.2 | 0.2 | 0.2 | 0.2 | 0.2 |
| Viscosity Increase Rate (%) |  | 20 | 50 | 20 | 50 | 10 | 30 | 50 |

|  | Unit | Example 8 | Example 9 | Example 10 | Example 11 | Example 12 |
|---|---|---|---|---|---|---|
| (a-1) | Parts by Mass | 50.00 | 50.00 | 50.00 | 50.00 | 50.00 |
| (b-1) | Parts by Mass | 50.00 | 50.00 | 50.00 | 50.00 | 50.00 |
| (b-2) | Parts by Mass | 0.00 | 0.40 | 0.40 | 0.40 | 0.40 |
| (d-1) | Parts by Mass | 5.00 | 5.00 | 5.00 | 5.00 | 5.00 |
| (e-1) | Parts by Mass | 0.03 | 0.03 | 0.03 | 0.03 | 0.03 |
| (f-1) | Parts by Mass |  | 200.00 | 120.00 |  |  |

TABLE 1-continued

|  | | | | | | |
|---|---|---|---|---|---|---|
| (f-2) | Parts by Mass | | | 80.00 | 300.00 | 400.00 |
| (C) Components | ppm | 3.2 | 3.2 | 3.2 | 3.2 | 3.2 |
| Chemical Equivalent Ratio(hydrosilyl group/alkenyl group) | | 0.3 | 0.4 | 0.4 | 0.4 | 0.4 |
| Viscosity (mPa · s) | | 350 | 1,800 | 1,300 | 3,500 | 10,000 |
| Impregnation Distance (mm) | 20 μm | 10 | 5 | 6 | 3 | 0 |
| 25 ± 5° C. | 80 μm | 20 | 10 | 12 | 7 | 2 |
| Curing Characteristics Storage Modulus (Mpa) | | 0.6 | 1.7 | 1.9 | 2.1 | 2.9 |
| Tensile Shear Bonding Strength (MPa) | | 0.1 | 2.7 | 3.0 | 2.6 | 2.6 |
| Heat Conduction Rate (W/m · K) | | 0.2 | 1.0 | 1.2 | 1.4 | 1.5 |
| Viscosity Increase Rate (%) | | 10 | 20 | 20 | 20 | 20 |

(C) Value for component (C) is mass weight of platinum metal relative to total weight of component (A) and component (B) (units ppm)

TABLE 2

|  | Unit | Comparative Example 1 | Comparative Example 2 | Comparative Example 3 |
|---|---|---|---|---|
| (a-1) | Parts by Mass | Epoxy | 50.00 | 50.00 |
| (b-1) | Parts by Mass | Underfill | 50.00 | 50.00 |
| (b-2) | Parts by Mass | | 0.40 | 0.40 |
| (d-1) | Parts by Mass | | 0.00 | 5.00 |
| (e-1) | Parts by Mass | | 0.03 | 0.00 |
| (f-1) | Parts by Mass | | | |
| (f-2) | Parts by Mass | | | |
| (C) Components | ppm | 0.0 | 3.2 | 3.2 |
| Chemical Equivalent Ratio(Hydrosilyl group/alkenyl group) | | — | 0.4 | 0.4 |
| Viscosity (mPa · s) | | 10,000 | 370 | 360 |
| Impregnation Distance | 20 μm | 0 | 10 | 10 |
| (mm) 25 ± 5° C. | 80 μm | 2 | 20 | 20 |
| Curing Characteristics Storage Modulus (MPa) | | Measurement not possible due to lack of solidity | Measurement not possible due to lack of solidity | 0.8 |
| Tensile Shear Bonding Strength (MPa) | | Measurement not possible due to lack of solidity | Measurement not possible due to lack of solidity | 1.6 |
| Heat Conduction Rate (W/m · K) | | 0.5 | 0.2 | 0.2 |
| Viscosity Increase Rate (%) | | 100 | 20 | Measurement not possible due to gel state |

(C) Value for component (C) is mass weight of platinum metal relative to total weight of component (A) and component (B) (units ppm)

TABLE 3

|  | Unit | Example 13 | Example 14 | Example 15 | Example 16 | Example 17 |
|---|---|---|---|---|---|---|
| (a-1) | Parts by Mass | 50.00 | | | | |
| (a-2) | Parts by Mass | | 50.00 | | | |
| (a-3) | Parts by Mass | | | 30.00 | 40.00 | 50.00 |
| (b-1) | Parts by Mass | 50.00 | | 70.00 | 60.00 | 50.00 |
| (b-2) | Parts by Mass | 0.40 | 1.00 | 0.40 | 0.40 | 0.40 |
| (b-3) | Parts by Mass | | 50.00 | | | |
| (d-1) | Parts by Mass | 5.00 | 1.00 | 0.50 | 0.50 | 0.50 |
| (e-1) | Parts by Mass | | 0.03 | 0.03 | 0.03 | 0.03 |
| (e-2) | Parts by Mass | 0.03 | | | | |
| (f-1) | Parts by Mass | | | | | |
| (f-2) | Parts by Mass | | | | | |
| (C) Components | ppm | 3.2 | 4.0 | 2.1 | 2.8 | 3.5 |
| Chemical Equivalent Ratio(Hydrosilyl group/alkenyl group) | | 0.4 | 0.7 | 0.6 | 0.5 | 0.4 |
| Viscosity (mPa · s) | | 350 | 800 | 730 | 660 | 600 |
| Impregnation Distance (mm) | 20 μm | 10 | 7 | 7 | 7 | 8 |
| 25 ± 5° C. | 80 μm | 21 | 14 | 15 | 16 | 17 |
| Curing Characteristics Storage Modulus (MPa) | | 0.8 | 0.4 | 1.1 | 0.9 | 0.7 |
| Tensile Shear Bonding Strength (MPa) | | 1.6 | 1.1 | 1.8 | 1.6 | 1.5 |
| Heat Conduction Rate (W/m · K) | | 0.2 | 0.2 | 0.2 | 0.2 | 0.2 |
| Viscosity Increase Rate (%) | | 25 | 10 | 10 | 10 | 15 |

|  | Unit | Example 18 | Example 19 | Example 20 | Example 21 |
|---|---|---|---|---|---|
| (a-1) | Parts by Mass | | | | |
| (a-2) | Parts by Mass | | | | |

TABLE 3-continued

| | | | | | |
|---|---|---|---|---|---|
| (a-3) | Parts by Mass | 60.00 | 70.00 | 70.00 | 70.00 |
| (b-1) | Parts by Mass | 40.00 | 30.00 | 30.00 | 30.00 |
| (b-2) | Parts by Mass | 0.40 | 0.40 | 1.00 | 5.00 |
| (b-3) | Parts by Mass | | | | |
| (d-1) | Parts by Mass | 0.50 | 0.50 | 0.50 | 0.50 |
| (e-1) | Parts by Mass | 0.03 | 0.03 | 0.03 | 0.03 |
| (e-2) | Parts by Mass | | | | |
| (f-1) | Parts by Mass | | | | |
| (f-2) | Parts by Mass | | | | |
| (C) Components | ppm | 4.2 | 4.9 | 4.9 | 4.9 |
| Chemical Equivalent Ratio(Hydrosilyl group/alkenyl group) | | 0.4 | 0.3 | 0.4 | 1.1 |
| Viscosity (mPa · s) | | 570 | 430 | 440 | 460 |
| Impregnation Distance (mm) | 20 μm | 8 | 9 | 9 | 8 |
| 25 ± 5° C. | 80 μm | 18 | 19 | 19 | 18 |
| Curing Characteristics Storage Modulus (MPa) | | 0.5 | 0.2 | 1.0 | 2.0 |
| Tensile Shear Bonding Strength (MPa) | | 1.2 | 1.1 | 1.8 | 2.3 |
| Heat Conduction Rate (W/m · K) | | 0.2 | 0.2 | 0.2 | 0.2 |
| Viscosity Increase Rate (%) | | 20 | 25 | 35 | 40 |

(C) Value for component (C) is mass weight of platinum metal relative to total weight of component (A) and component (B) (units ppm)

Discussion of Experimental Results

As shown in Table 1 to Table 3, in comparison to a conventional epoxy resin composition (Comparative Example 1) and a silicone resin (Comparative Examples 2 and 3), the silicone-based resin composition according to the present invention (Examples 1-21) cures within 60 minutes, exhibits a low viscosity increase rate after standing for 24 hours at room temperature, and displays satisfactory pot life at room temperature as required for assembly and processing of electronic and electrical components. The silicone-based resin composition according to the present invention has a tendency to exhibit excellent bonding characteristics and excellent permeability into a micrometer-scale gap at room temperature. It has been shown that a resin composition for use as an underfill material that exhibits excellent heat-conductivity is obtained by adding a heat-conductive filler (F) (Examples 9-11).

Further description will be given hereafter based on the examples of the present invention. These examples are merely exemplary, and various modifications are possible, and such modifications may be construed by a person skilled in the art as falling within the scope of the present invention.

The present invention is a silicone-based resin composition for underfilling and sealing that permeates a gap between substrates of 100 μm or less at room temperature, that cures in a short time of at least 1 minute to 60 minutes or less in an atmosphere of at least 10° C. to 150° C. or less, and that exhibits bonding characteristics.

The present invention provides a resin composition that provides satisfactory characteristics as an underfill material which exhibits excellent filling characteristics and permeability into a gap between at least two substrates, that cures in a short time, and that exhibits excellent bonding characteristics and durability. The composition can be used as an underfill material that enables satisfactory pot life at room temperature which represents the normal atmospheric conditions during assembly operations of the electric and electronic components.

The resin composition according to the present invention enables sufficient permeation into a micrometer-scale gap.

The resin composition according to the present invention enables improvement to the reliability of electronic components in addition to improving productivity.

The present invention provides a structural body in which the resin composition is formed as an underfill material that seals a gap between at least two substrates. This structural body enables downsizing, weight reduction, high functionality and high quality of an electronic component when used as part of a semiconductor package or the like.

INDUSTRIAL APPLICABILITY

The resin composition according to the present invention is suitably used as a sealing resin on a semiconductor substrate, substrate for a robot or power module, automobile substrate, or a substrate for a electronic or electrical device such as electronic component, mobile telephone, flat panel display, television, or digital camera, or the like.

EXPLANATION OF REFERENCE NUMERALS

WIRING SUBSTRATE
SEMICONDUCTOR CHIP
SOLDER BUMP
UNDERFILL MATERIAL
ELECTRODE

The invention claimed is:
1. A resin composition comprising:
   (A) an organopolysiloxane that includes an alkenyl group,
   (B) an organopolysiloxane that includes a silicon atom-bonded hydrogen atom,
   (C) a hydrosilylation catalyst,
   (D) a silane coupling agent, and
   (E) an unsaturated dicarboxylic acid ester;
wherein the organopolysiloxane (B) having the silicon atom-bonded hydrogen atom comprises:
   (B-1) an organopolysiloxane having a molecular weight of 10,000 to 50,000;
   (B-2) an organopolysiloxane having a molecular weight of 100 to 5,000, and wherein the ratio of (B-2) to (B-1) is 0.01 mass % to 20 mass %.
2. The resin composition according to claim 1 wherein the hydrosilylation catalyst (C) is a platinum compound catalyst, and wherein the amount of the platinum metal in component (C) relative to the total mass of the component (A) and component (B) is within a range of 0.01 to 10 ppm in mass units.
3. The resin composition according to claim 2 wherein the resin composition further comprises a heat conductive filler (F).
4. A structural body wherein the resin composition according to claim 3 is used as an underfill material for sealing a gap between at least two substrates.

5. A structural body wherein the resin composition according to claim 2 is used as an underfill material for sealing a gap between at least two substrates.

6. The resin composition according to claim 1 wherein the resin composition permeates into a gap of 100 μm or less at 23±2° C. between the two or more substrates.

7. A structural body wherein the resin composition according to claim 6 is used as an underfill material for sealing a gap between at least two substrates.

8. The resin composition according to claim 1 wherein the resin composition is curable at a temperature of 10° C. to 150° C. in a period of one minute to 60 minutes.

9. A structural body wherein the resin composition according to claim 8 is used as an underfill material for sealing a gap between at least two substrates.

10. The resin composition according to claim 1 wherein the use of the resin composition is an underfill material.

11. A structural body wherein the resin composition according to claim 10 is used as an underfill material for sealing a gap between at least two substrates.

12. The resin composition according to claim 1 wherein the viscosity of the resin composition is within a range of 1 mPa·s to 4,000 mPa·s at 23±2° C.

13. A structural body wherein the resin composition according to claim 12 is used as an underfill material for sealing a gap between at least two substrates.

14. A structural body wherein the resin composition according to claim 1 is used as an underfill material for sealing a gap between at least two substrates.

15. The resin composition according to claim 1 wherein the resin composition further comprises a heat conductive filler (F).

16. A structural body wherein the resin composition according to claim 1 is used as an underfill material for sealing a gap between at least two substrates.

* * * * *